US012700436B2

(12) United States Patent
Amarnath et al.

(10) Patent No.: US 12,700,436 B2
(45) Date of Patent: Aug. 4, 2026

(54) COMPACT DATA LATCHES

(71) Applicant: Sandisk Technologies, Inc., Milpitas, CA (US)

(72) Inventors: Anirudh Amarnath, Fremont, CA (US); Adit Pendam, Sunnyvale, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 139 days.

(21) Appl. No.: 18/619,543

(22) Filed: Mar. 28, 2024

(65) Prior Publication Data

US 2025/0308566 A1    Oct. 2, 2025

(51) Int. Cl.
*G11C 7/10*          (2006.01)

(52) U.S. Cl.
CPC .......... *G11C 7/1069* (2013.01); *G11C 7/1039* (2013.01); *G11C 7/106* (2013.01)

(58) Field of Classification Search
CPC ....................................................... G11C 7/106
See application file for complete search history.

(56) References Cited

U.S. PATENT DOCUMENTS

| | | |
|---|---|---|
| 9,042,183 B2 | 5/2015 | Kamata et al. |
| 9,135,989 B2 | 9/2015 | Sakai et al. |
| 9,317,451 B2 | 4/2016 | Suzuki et al. |
| 10,796,779 B2 | 10/2020 | Maejima et al. |
| 10,825,489 B2 | 11/2020 | Kenyon |
| 11,127,470 B2 | 9/2021 | Sako |
| 2013/0257483 A1 | 10/2013 | Bulzacchelli |
| 2018/0211700 A1* | 7/2018 | Kamata ............... G11C 11/5642 |

* cited by examiner

*Primary Examiner* — Hoai V Ho
(74) *Attorney, Agent, or Firm* — Pearl Cohen Zedek Latzer Baratz LLP

(57)          ABSTRACT

Technology for compact data latches. Two global driver transistors are each connected to a large number of compact data latches. The global driver transistors may be operated during a simultaneous latch operation in each of the compact data latches. A latch operation may discharge a high voltage from a latch output, depending on whether that output is to go from the high voltage to a low voltage. Such discharge could lead to a shoot through voltage and/or fight between a PMOS and an NMOS transistor in the data latch. Turning off one of the global driver transistors during a latch operation prevents shoot through current and also prevents a fight between a PMOS and an NMOS transistor in the data latch. The global driver transistors occupy a small chip area.

18 Claims, 17 Drawing Sheets

403

| Block M-1 |
| :---: |
| ⋮ |
| Block 2 |
| Block 1 |
| Block 0 |

407

405

| Block M-1 |
| :---: |
| ⋮ |
| Block 2 |
| Block 1 |
| Block 0 |

LAT     VDDSA
                                    VSS

INV     VSS
                                    VDDSA

LBUS    VSS                         VSS

VL      VDDSA                       VDDSA

VI      VDDSA                       VDDSA

VDD
TL      VSS                         VSS

VDDSA
LL      VSS                         VSS

TI      VSS

LI      VSS t1    t2    t3

COMPACT DATA LATCHES

BACKGROUND

The present disclosure relates to data latches.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

Non-volatile memory systems have read/write circuits to read and write the non-volatile memory cells. Data latches may be used to store information to be programmed into the non-volatile memory cells or to store information that was sensed from the non-volatile memory cells. The data latches can occupy a significant amount of chip area.

BRIEF DESCRIPTION OF THE DRAWINGS

Like-numbered elements refer to common components in the different figures.

DETAILED DESCRIPTION

Technology is disclosed for compact data latches. In an embodiment, two global driver transistors are each connected to a large number of compact data latches. The global driver transistors may be operated during a simultaneous latch operation in each of the compact data latches. Each data latch may have a first output and a second output that store complimentary bit values in the form of a high voltage on one output and a low voltage on the other output. A latch operation may discharge the high voltage from one of the outputs, depending on whether that output is to go from the high voltage to the low voltage. Such discharge could lead to a shoot through voltage and/or fight between a PMOS and an NMOS transistor in the data latch. Turning off one of the global driver transistors during a latch operation prevents shoot through current and also prevents a fight between a PMOS and an NMOS transistor in the data latch. Maintaining the other global driver transistor in an on state during the latch operation allows the on global driver transistor to charge up the output of the compact data latch that is not discharged. The global driver transistors occupy a very small area of the chip.

Figure 1:
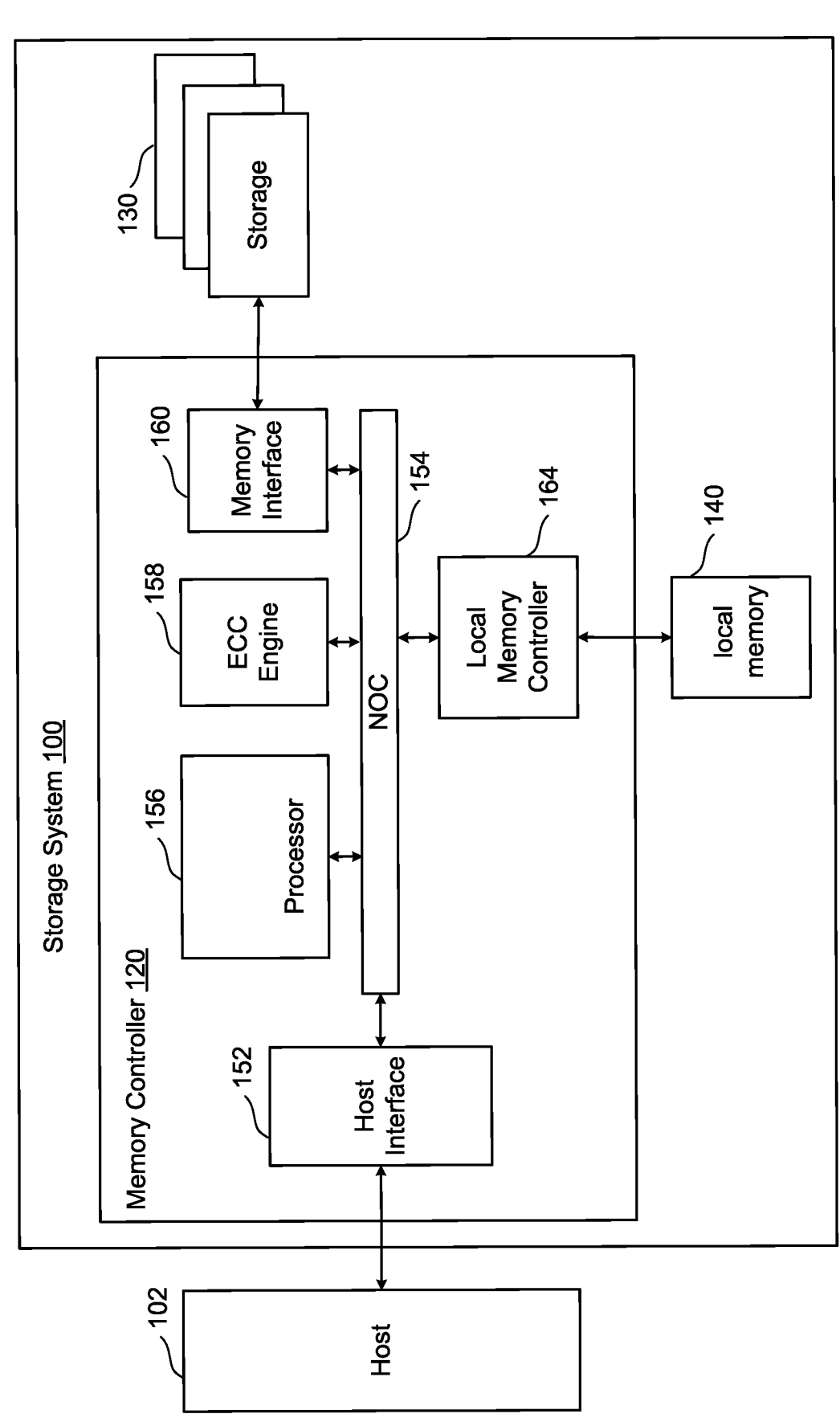
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
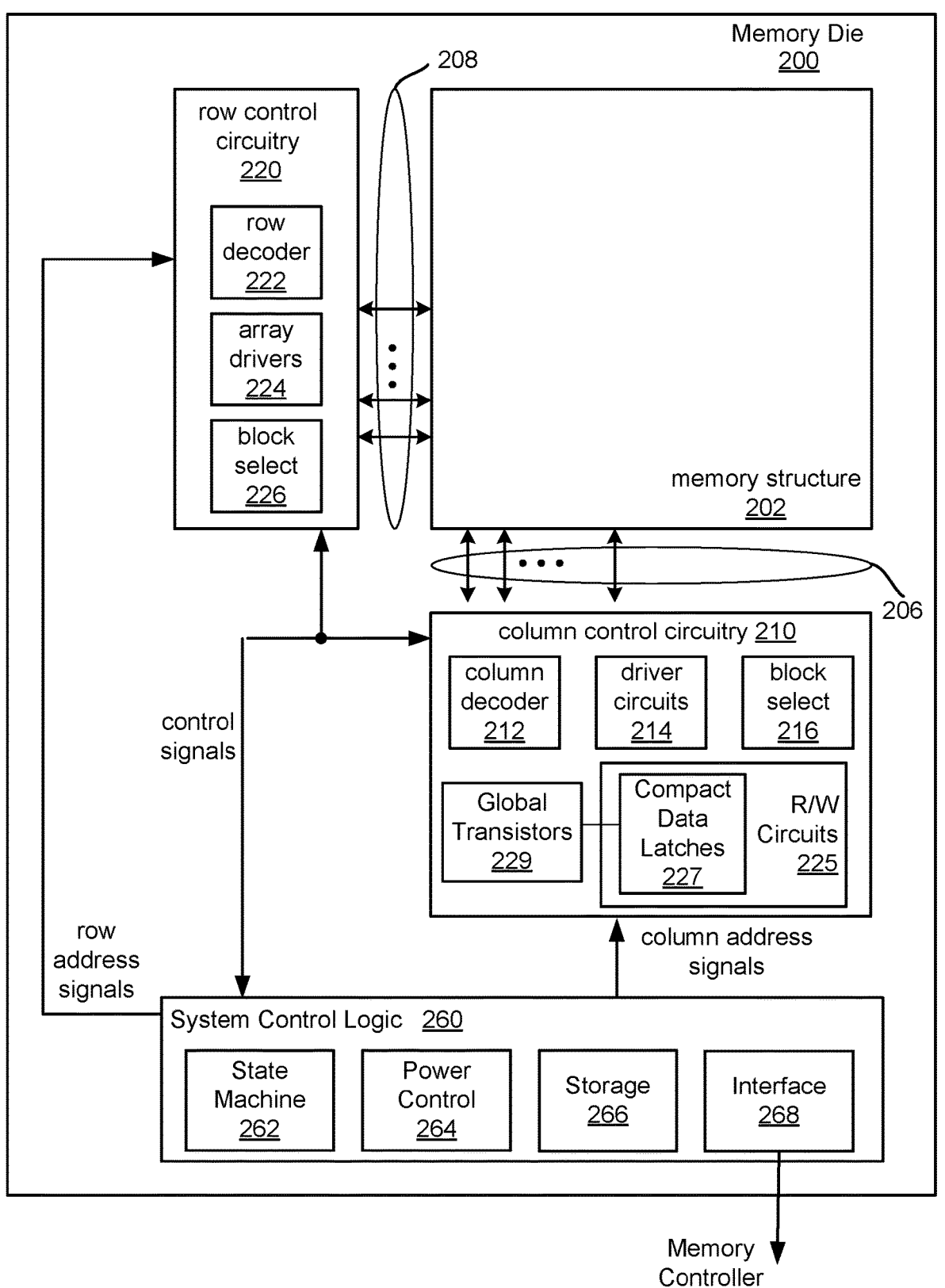
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 contain compact data latches 227. The read/write circuits 225 also contain sense amplifiers. A compact data latch may be part of a sense amplifier or external to a sense amplifier. Global transistors 229 are connected to the compact data latches. Further details of embodiments of compact data latches 227 and global transistors 229 are described herein. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers. The system control logic 260, column control circuitry 210, and/or row control circuitry 220 are configured to control memory operations such as open block reads at the die level.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
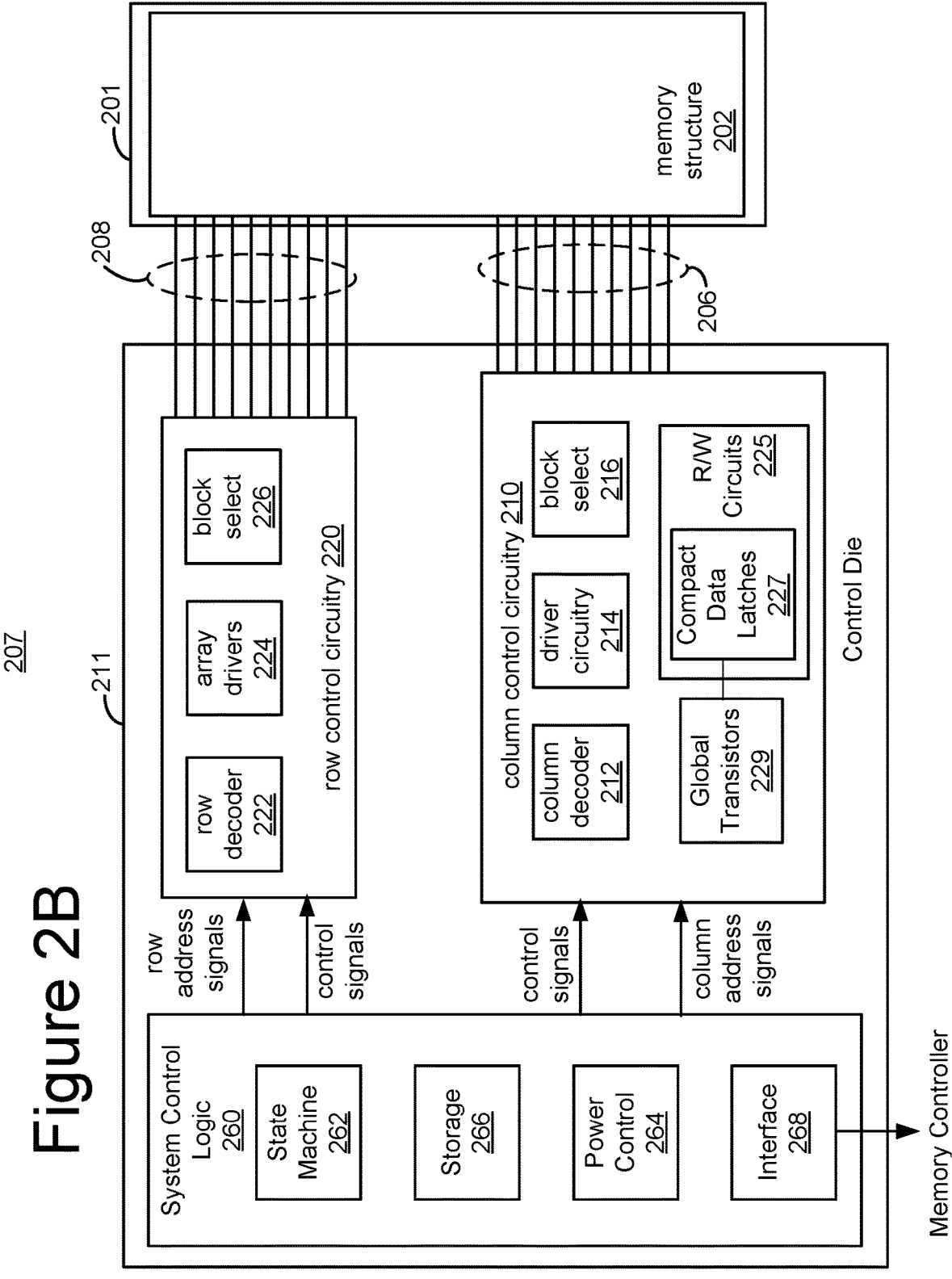
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, storage 130, memory die 200, integrated memory assembly 207, and/or control die 211.

Figure 3A:
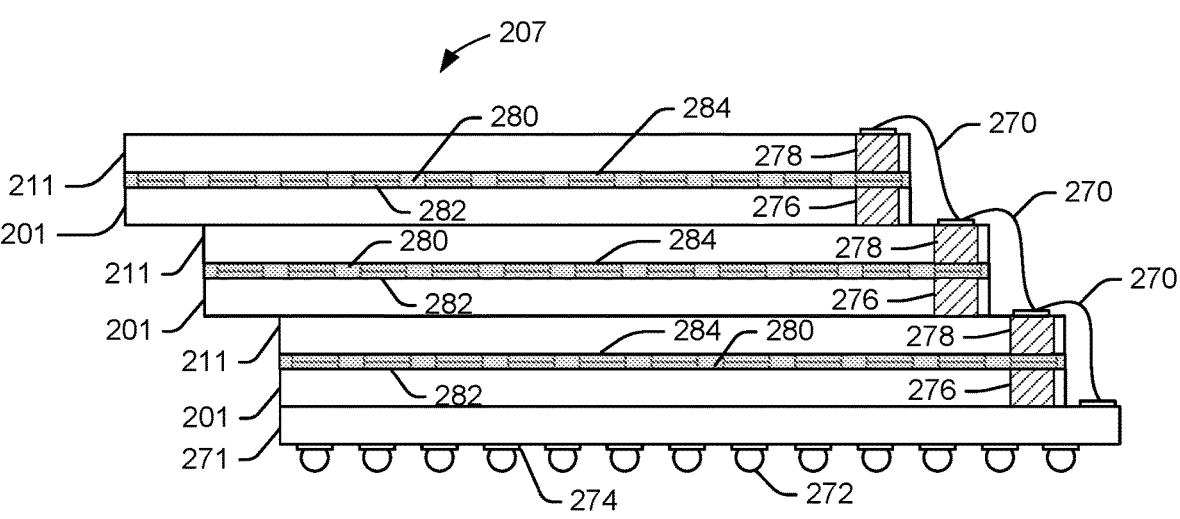
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
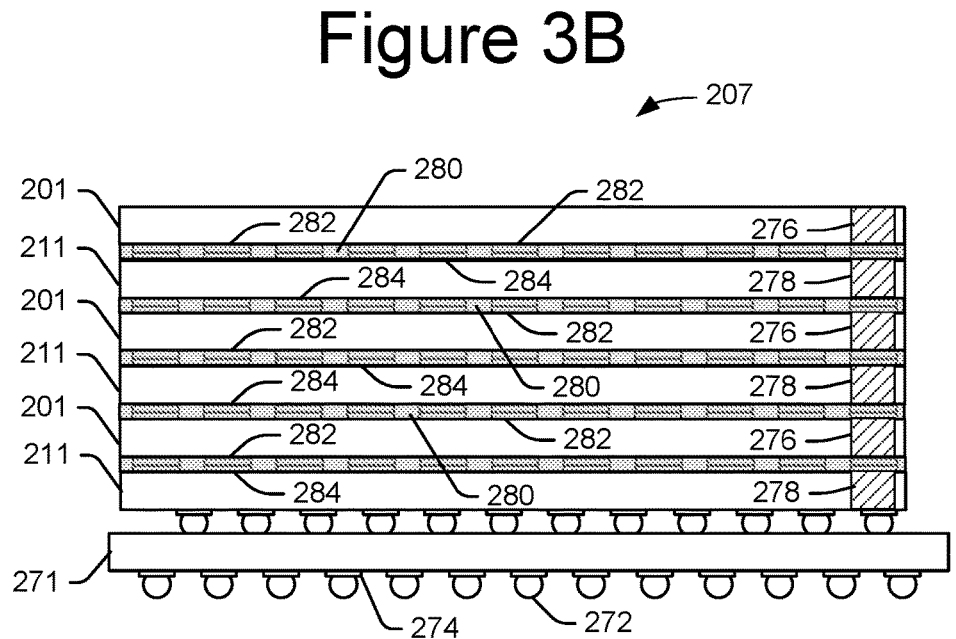

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material. In a so-called Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3C:
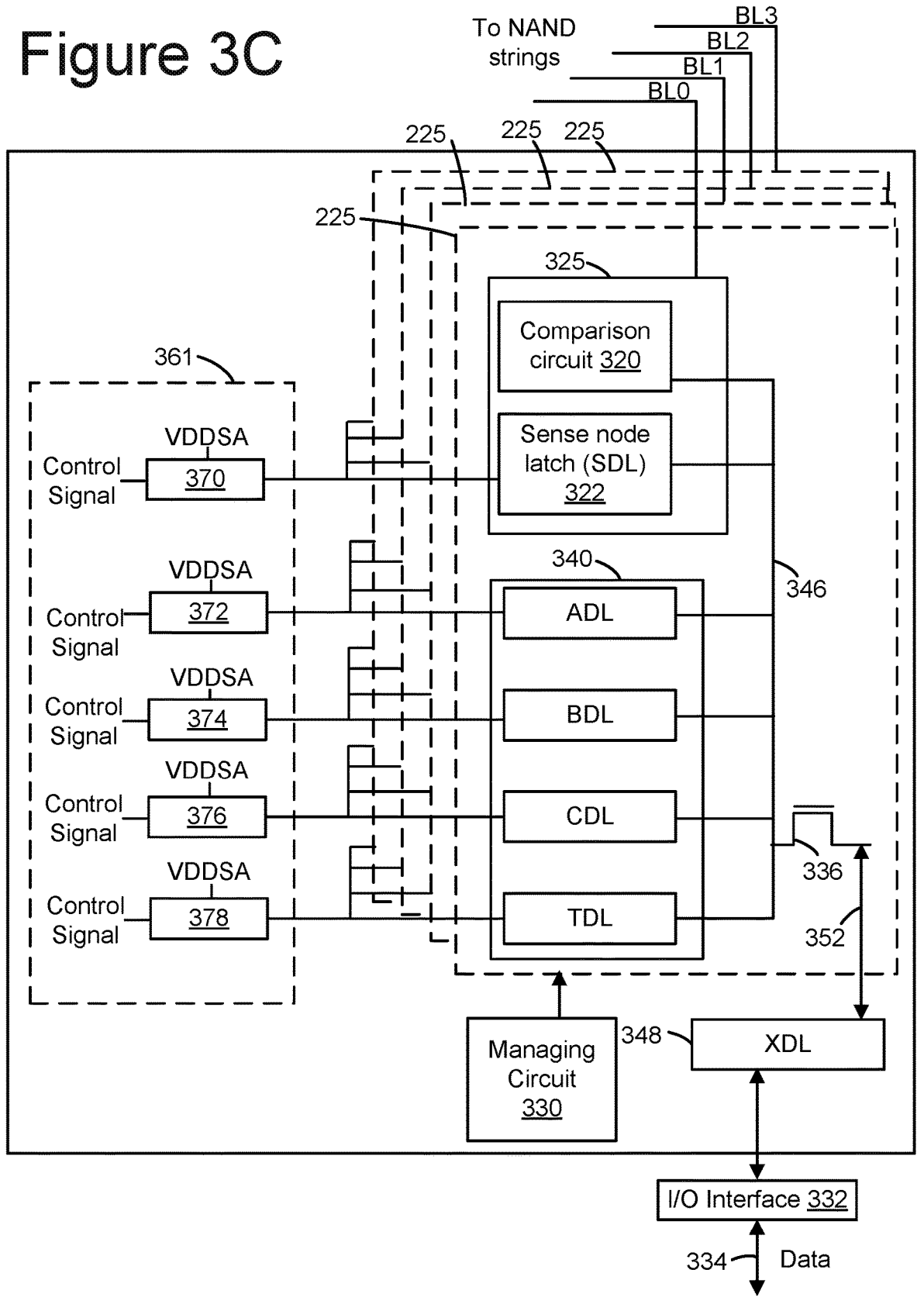
FIG. 3C is a block diagram depicting one embodiment of read/write circuits and associated elements.

FIG. 3C is a block diagram depicting one embodiment of read/write circuits 225 and associated elements. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the program verify voltage. A sense node latch (SDL) 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include four latches (ADL, BDL, CDL, TDL) for each sense amplifier 325 in this example. More or fewer than four latches may be included in the data latches 340. In one embodiment, for programming three of the data latches 340 (e.g., ADL, BDL, CDL) are used to store one bit each to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data.

In an embodiment, the TDL latch may be used for a quick pass write (QPW). QPW can be used to store a bit which indicates whether the associated storage element is in a quick pass write mode (e.g., whether its Vth is between the lower and higher verify levels in which case the storage element experiences slow programming). A program option which uses a slow programming mode may be referred to as a "quick pass write" (QPW) technique. QPW can be used independently in one or more passes of a multiple pass programming technique. Although, generally, it is sufficient to use QPW in the final programming pass when accuracy is most important. QPW mode and slow programming mode are used interchangeably herein. Further details of QPW are described in U.S. Pat. No. 9,135,989, "Write Data Preservation for Non-Volatile Storage," which is hereby incorporated by reference.

Each read/write circuit 225 is connected to an XDL latch 348 by way of an XDL bus 352. In this example, transistor 336 connects local data bus 346 to XDL bus 352. One XDL latch 348 of the many XDL latches is depicted. An I/O interface 332 is connected to the XDL latches 348. The XDL latch 348 associated with a particular read/write circuit 225 serves as an interface latch for storing/latching data from the memory controller.

In an embodiment, one or more of the data latches are compact data latches. For example one or more of SDL, ADL, BDL, CDL, and/or TDL may be a compact data latch, as described herein. In an embodiment, one or more global transistors is/are shared among a large number of compact data latches. For example, global transistor 370 is shared among a large number of SDL latches, global transistor 372 is shared among a large number of ADL latches, global transistor 374 is shared among a large number of BDL latches, global transistor 376 is shared among a large number of CDL latches, and global transistor 378 is shared among a large number of TDL latches. Each global transistor may be connected to a terminal (e.g., source) of a transistor (e.g., PMOS transistor) in a compact data latch. Each global transistor is able to selectively pass a high data state voltage (e.g., VDDSA or about 3.3V) to the transistor in the compact data latch or to cut off the transistor in the compact data latch from the high data state voltage. The control signal may be used to turn on the global driver transistor to selectively pass VDDSA or to turn off the global driver transistor to not pass VDDSA. In one embodiment, two global transistors are connected to each compact data latch, as will be explained in more detail below. FIG. 3C depicts one set of five global transistors in region 361, but in an embodiment, there are two sets of global transistors in region 361. In an embodiment, there is a one-to-one correspondence between a set of global transistors in region 361 and a set of compact data latches in a read/write circuit 225. For example, global transistor 370 corresponds to SDL 332 in a large number of read/write circuits 225, global transistor 372 corresponds to ADL in a large number of read/write circuits 225, etc. The global transistors may be located in a separate region 361 of the die from the read/write circuits 225. The global transistors occupy a small chip area.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
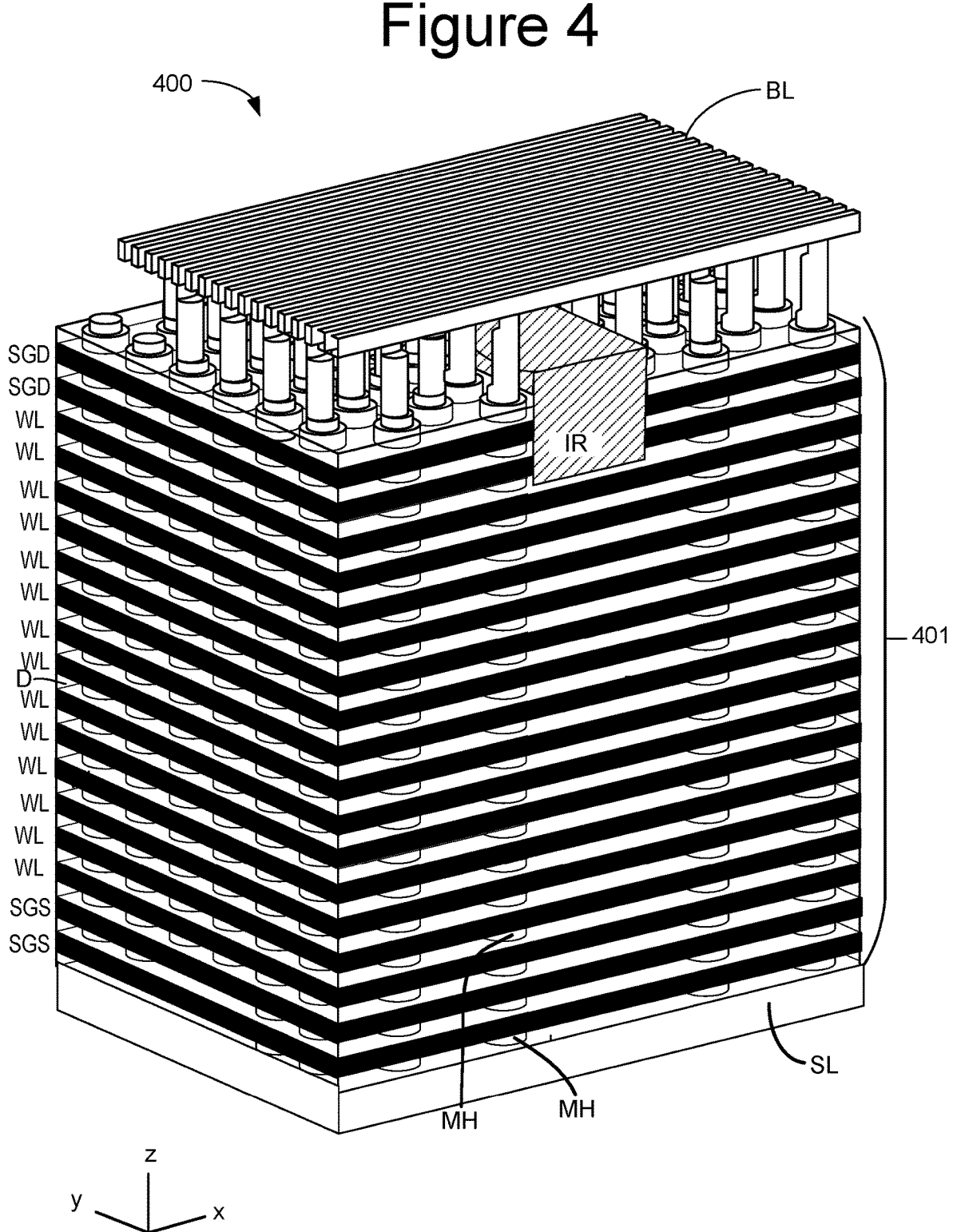
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D. The conductive layers are labeled as one of: SGD, WL, or SGS. An SGD conductive layer serves as drain side select lines. A WL conductive layer serves as a word line. An SGS conductive layer serves as a source side select line. The numbers of each of these conductive layers is limited for ease of illustration. The number of alternating dielectric layers and conductive layers can vary based on specific implementation requirements. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

In one embodiment the block is operated as a number of "strings." Each of these "strings" has many NAND strings. In an embodiment, an isolation region (IR) divides the SGD layers into multiple SGD select lines, each of which is used to select a string (e.g., set of NAND strings). FIG. 4 depicts an example having one IR region and thereby two strings. However, there may be more than one IR region and thereby more than two strings. Optionally, the IR region can extend down through all of the alternating dielectric layers and conductive layers.

Figure 4A:
FIG. 4A is a block diagram of one embodiment of a memory structure having two planes.

FIG. 4A is a block diagram explaining one example organization of memory structure 202, which is divided into two planes 403 and 405. Each plane is then divided into M physical blocks. In one example, each plane has about 2000 physical blocks (or more briefly "blocks"). However, different numbers of blocks and planes can also be used. In one "full-block" embodiment, a block of memory cells is a unit of erase. That is, all memory cells of a block are erased together. In a "sub-block mode" embodiment, blocks are divided into sub-blocks and the sub-blocks are the unit of erase. In an embodiment, a block contains a number of word lines with each sub-block containing a unique set of the data word lines. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
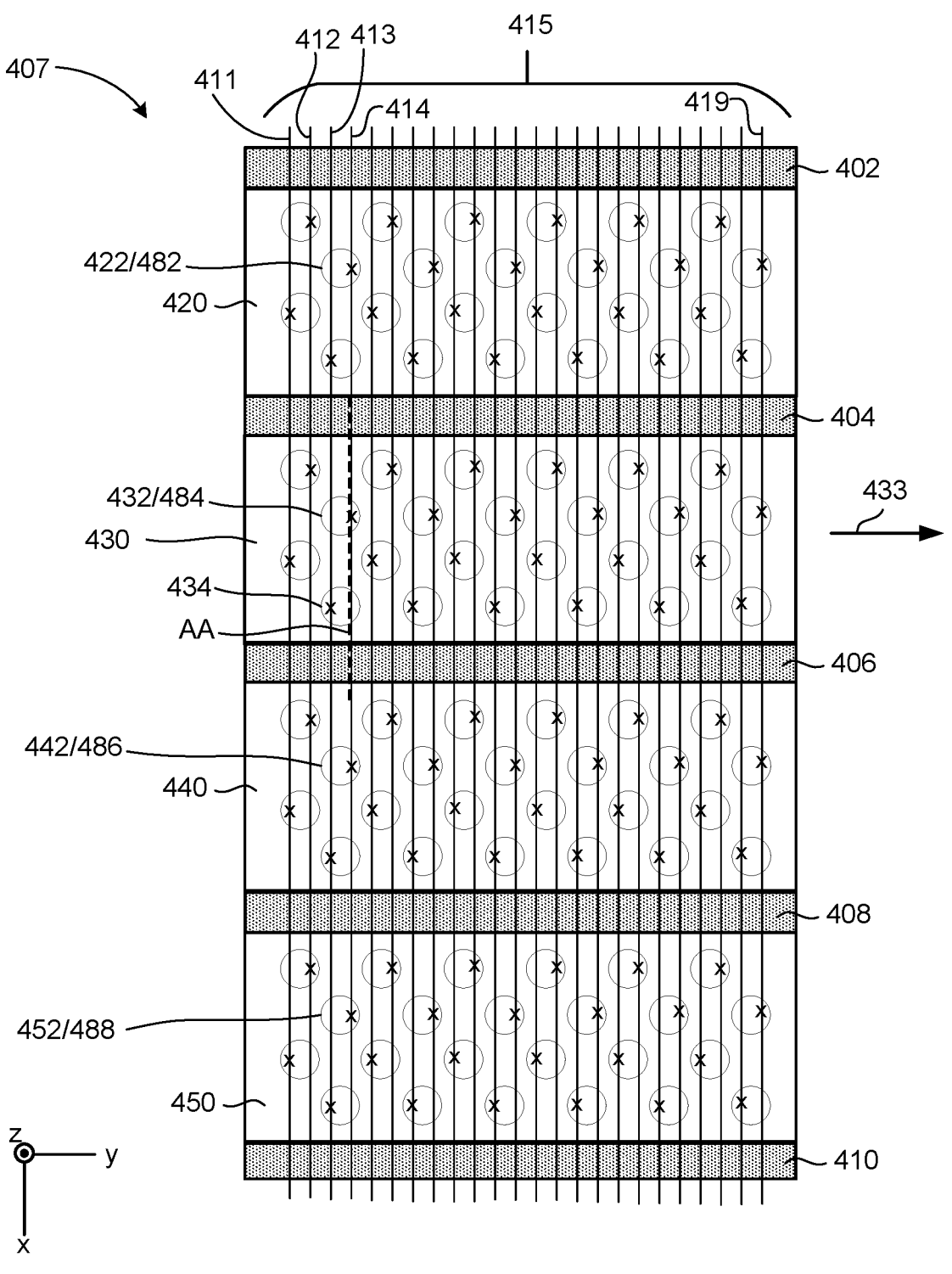
FIG. 4B is a block diagram depicting a top view of a portion of block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, and 452. Vertical column 422 implements NAND string 482. Vertical column 432 implements NAND string 484. Vertical column 442 implements NAND string 486. Vertical column 452 implements NAND string 488. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The physical block depicted in FIG. 4B includes a set of isolation regions 402, 404, 406, 408, and 410, which are formed of $SiO_2$; however, other dielectric materials can also be used. Isolation regions 402, 404, 406, 408, and 410 serve to divide the top layers of the physical block into four regions; for example, the top layer depicted in FIG. 4B is divided into regions 420, 430, 440, and 450, which are referred to herein as "strings. Each string contains a large number of NAND strings. In one embodiment, isolation regions 402 and 410 separate the physical block 407 from adjacent physical blocks. Thus, isolation regions 402 and 410 may extend down to the substrate. In one embodiment, the isolation regions 404, 406, and 408 only divide the layers used to implement select gates so that NAND strings in different strings can be independently selected. Referring back to FIG. 4, the IR region may correspond to any of isolation regions 404, 406, or 408. In one example implementation, a bit line only connects to one vertical column/NAND string in each of regions (sub-blocks) 420, 430, 440, and 450. In that implementation, each physical block has sixteen rows of active columns and each bit line connects to four NAND strings in each block. In one embodiment, all of the four vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region (420, 430, 440, 450) having four rows of vertical columns, four regions (420, 430, 440, 450) and sixteen rows of vertical columns in a block, those exact numbers are an example implementation. Other embodiments may include more or fewer regions (420, 430, 440, 450) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
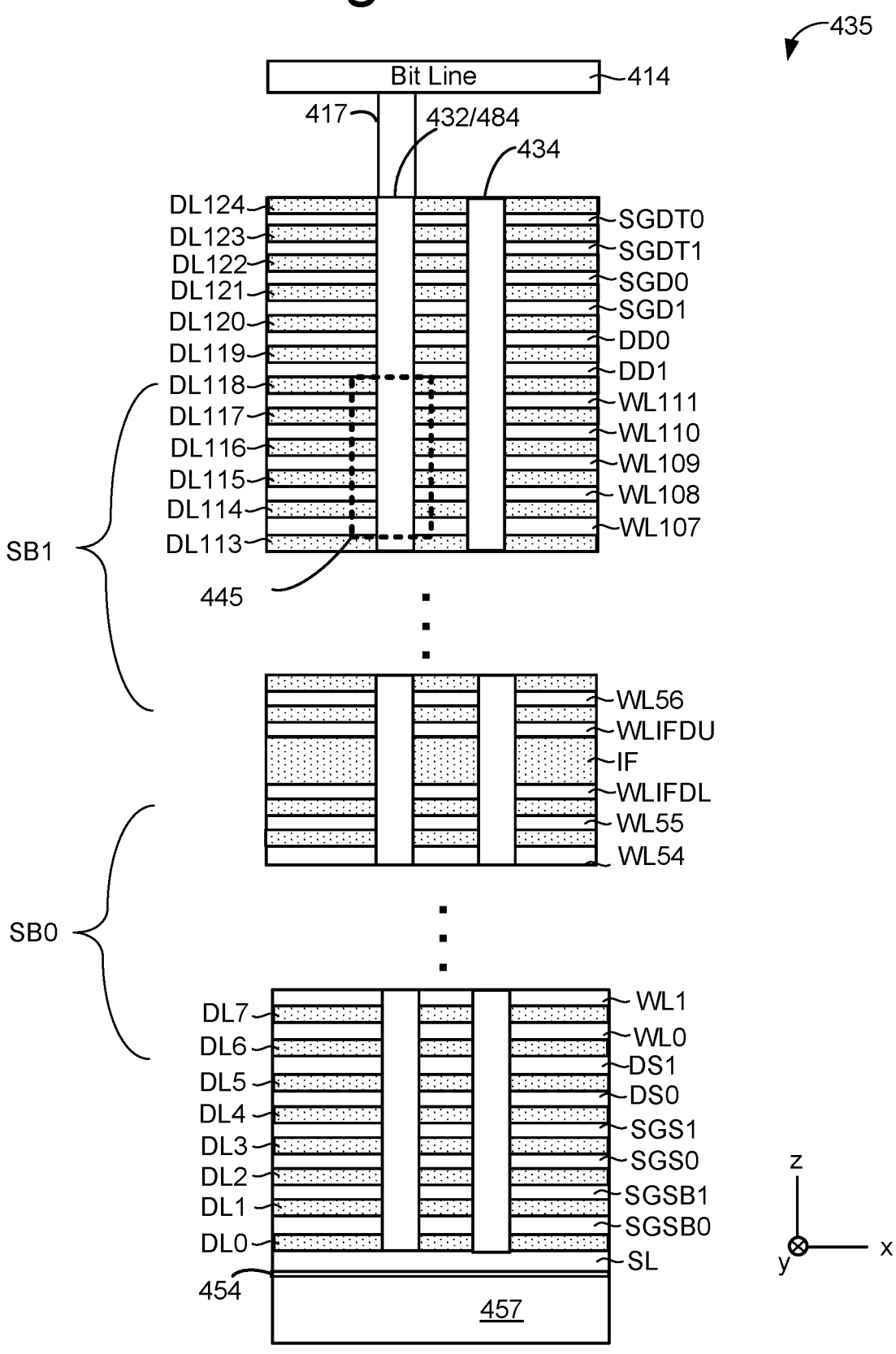
FIG. 4C depicts an embodiment of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Six dummy word line layers DD0, DD1, WLIFDU, WLIDDL, DS1, and DS0 are provided, in addition to the data word line layers WL0-WL111. There may be more or fewer than 112 data word line layers and more or fewer than four dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have the same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

FIG. 4C depicts an example of a stack 435 having two sub-blocks (SB). The two SB stack comprises SB0 and SB1. A two SB or other multi-SB stack can be used to form a relatively tall stack while maintaining a relatively narrow memory hole width (or diameter). After the layers of the lower SB are formed, memory hole portions are formed in the lower SB. Subsequently, after the layers of the upper SB are formed, memory hole portions are formed in the upper SB, aligned with the memory hole portions in the lower SB to form continuous memory holes from the bottom to the top of the stack. The resulting memory hole is narrower than would be the case if the hole were etched from the top to the bottom of the stack rather than in each SB individually. An interface (IF) region is created where the two SBs are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, SB0 and SB1 are erased independent of one another. Hence, data may be maintained in SB0 after SB1 is erased. Likewise, data may be maintained in the SB1 after SB0 is erased. Independently erasing the sub-blocks is referred to herein as a sub-block mode (SBM).

Figure 4D:
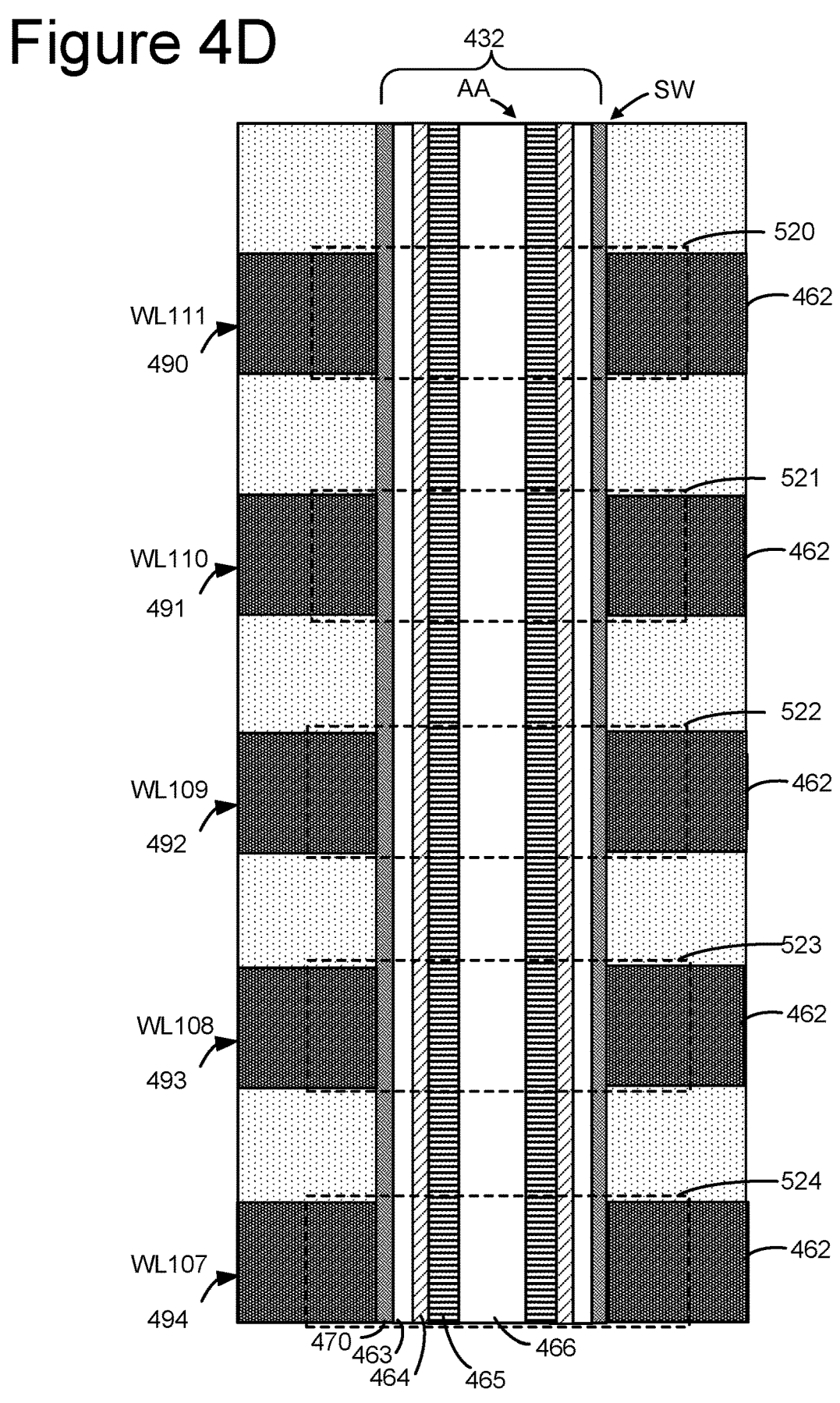
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
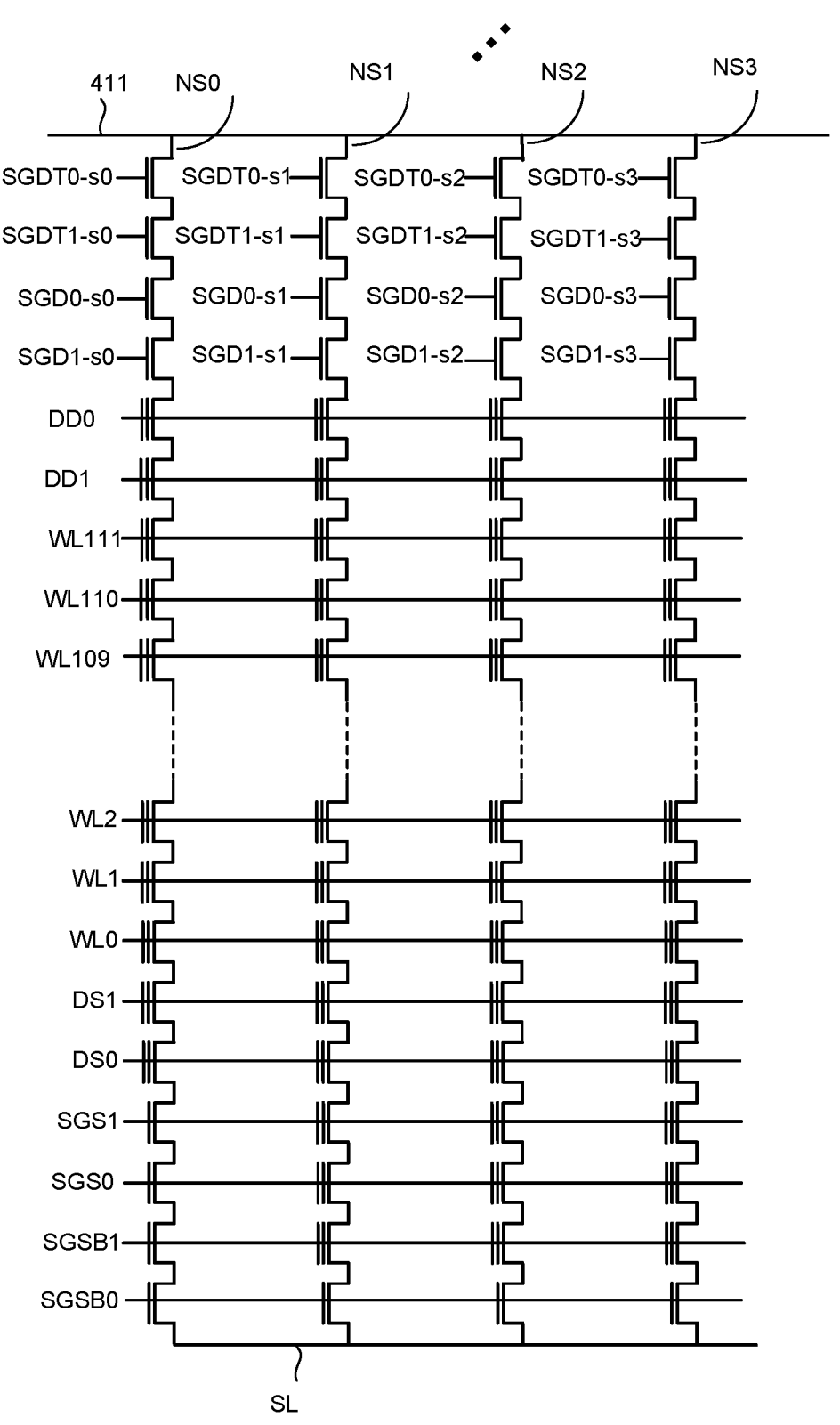
FIG. 4E is a schematic diagram of a portion of one embodiment of a block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to four NAND strings. Thus, FIG. 4E shows bit line 411 connected to NAND string NS0, NAND string NS1, NAND string NS2, and NAND string NS3.

In one embodiment, there are four sets of drain side select lines in the physical block. For example, the set of drain side select lines connected to NS0 include SGDT0-s0, SGDT-s0, SGD0-s0, and SGD-s0. The set of drain side select lines connected to NS1 include SGDT0-s1, SGDT-s1, SGD0-s1, and SGD-s1. The set of drain side select lines connected to NS2 include SGDT0-s2, SGDT-s2, SGD0-s2, and SGD-s2. The set of drain side select lines connected to NS3 include SGDT0-s3, SGDT-s3, SGD0-s3, and SGD-s3. Herein the term "SGD" may be used as a general term to refer to any one or more of the lines in a set of drain side select lines. In some embodiments, the same operating voltage is applied to SGDT0 and SGDT1. In some embodiments, the same operating voltage is applied to SGD0 and SGD1. In some erase embodiments, different operating voltage are applied to SGDT0/SGDT1 than to SGD0/SGD1. Note that SGDT0/SGDT1 are adjacent to the bit line. In some erase embodiments, a voltage applied to SGDT0/SGDT1 in combination with a bit line voltage may be used to generate a gate induced gate leakage (GIDL) current. Such a voltage applied to SGDT0/SGDT1 may be referred to herein as a GIDL voltage.

In an embodiment, each line in a given set may be operated independent from the other lines in that set to allow for different voltages to the gates of the four drain side select transistors on the NAND string. Moreover, each set of drain side select lines can be selected independent of the other sets. Each set drain side select lines connects to a group of NAND strings in the block. Only one NAND string of each group is depicted in FIG. 4E. These four sets of drain side select lines correspond to four "strings," as the term string has been defined herein. A first string corresponds to those vertical NAND strings controlled by SGDT0-s0, SGDT-s0, SGD0-s0, and SGD-s0. A second string corresponds to those vertical NAND strings controlled by SGDT0-s1, SGDT-s1, SGD0-s1, and SGD-s1. A third string corresponds to those vertical NAND strings controlled by SGDT0-s2, SGDT-s2, SGD0-s2, and SGD-s2. A fourth string corresponds to those vertical NAND strings controlled by SGDT0-s3, SGDT-s3, SGD0-s3, and SGD-s3. As noted, FIG. 4E only shows the NAND strings connected to bit line 411. However, a full schematic of the block would show every bit line and four vertical NAND strings connected to each bit line.

In one embodiment, all of the memory cells on the NAND strings in a physical block are erased as a unit. However in some embodiments, a physical block is operated as multiple sub-blocks, with each sub-block containing a contiguous set of word lines. For example, memory cells connected to WL0-WL55 may be in SB0 and memory cells connected to WL56-WL111 may be in SB1. In a sub-block mode, SB0 and SB1 may be erased separately. Hence, memory cells connected to WL0-WL55 may be in one erase unit and memory cells connected to WL56-WL111 may be in another erase unit. A physical block could be operated in more than two sub-blocks. Erase units can be formed based on other divisions of physical blocks.

Although the example memories of FIGS. 4-4E are three dimensional memory structure that includes vertical NAND strings with charge-trapping material, other 3D memory structures can also be used with the technology described herein.

Figures 5A, 5B:
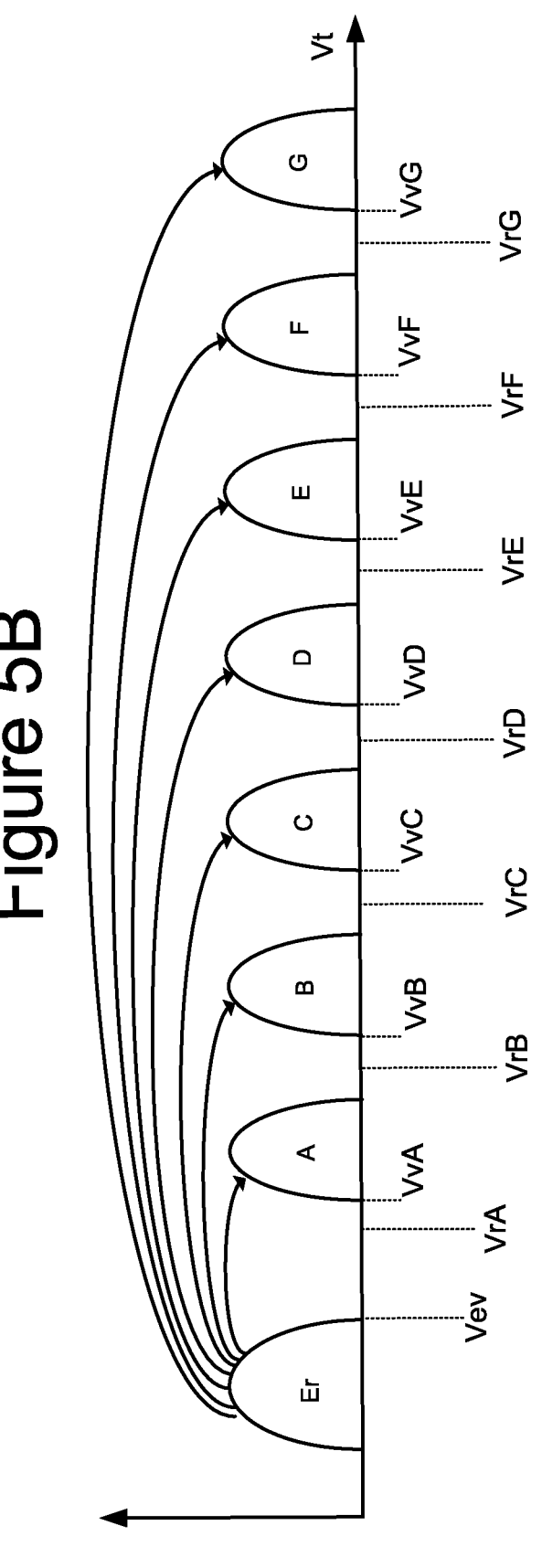
FIGS. 5A and 5B depicts threshold voltage distributions.

The storage systems discussed above can be erased, programmed and read. Embodiments of compact data latches are used to store information during erase, program and/or read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine whether a memory cells is erased (state E) or programmed (state P). FIG. 5A also depicts program verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MHLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify reference voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

Figure 6:
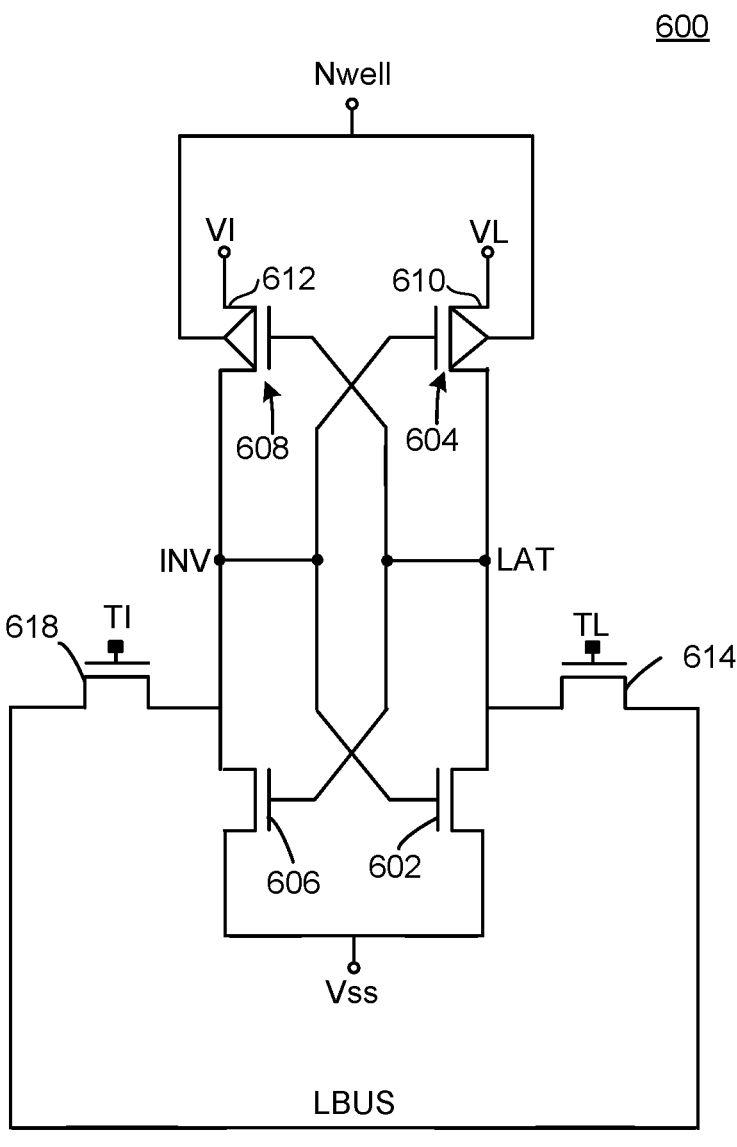
FIG. 6 is a schematic diagram of an embodiment of a compact data latch.

FIG. 6 is a schematic diagram of an embodiment of a compact data latch 600. The compact data latch 600 has a pair of cross-coupled CMOS inverters. NMOS transistor 602 and PMOS transistor 604 form a first CMOS inverter. NMOS transistor 606 and PMOS transistor 608 form a second CMOS inverter. The node LAT (more briefly "LAT") is the output of the first CMOS inverter. The node INV (more briefly "INV") is the output of the second CMOS inverter. LAT is connected to the input of the second CMOS inverter. That is, LAT is connected to the gates of NMOS transistor 606 and PMOS transistor 608. INV is connected to the input of the first CMOS inverter. That is, INV is connected to the gates of NMOS transistor 602 and PMOS transistor 604. The compact data latch 600 is configured to latch a first bit value in the form of a first voltage on LAT and a second bit value in the form of a second voltage on INV. LAT and INV store complimentary bit values.

NMOS transistor 602 and NMOS transistor 606 are connected to a low voltage node to which Vss is applied. The n-wells of PMOS transistor 604 and PMOS transistor 608 are each connected to an Nwell node to which an Nwell voltage is applied. PMOS transistor 604 has a terminal 610 that is connected to a node labeled VL. Node VL is connected to a global VL driver transistor (not depicted in FIG. 6). PMOS transistor 608 has a terminal 612 to that is connected to a node labeled VI. Node VI is connected to a global VI driver transistor (not depicted in FIG. 6). First access transistor 614 is connected between LAT and a local data bus (LBUS). The compact data latch 600 has a Second access transistor 618 that is connected between INV and the local data bus (LBUS). In an embodiment, the compact data latch 600 is one of several compact data latches in a read/write circuit 225. The LBUS may be, but is not limited to, local data bus 346 (see FIG. 3C). The compact data latch 600 could be used for, but is not limited to, any of SDL, ADL, BDL, CDL, or TDL (see FIG. 3C).

Although the embodiment of the compact data latch 600 in FIG. 6 depicts a CMOS device having NMOS and PMOS transistors, other technologies such as bipolar (e.g., PNP, NPN) technologies may be used.

Figure 7:
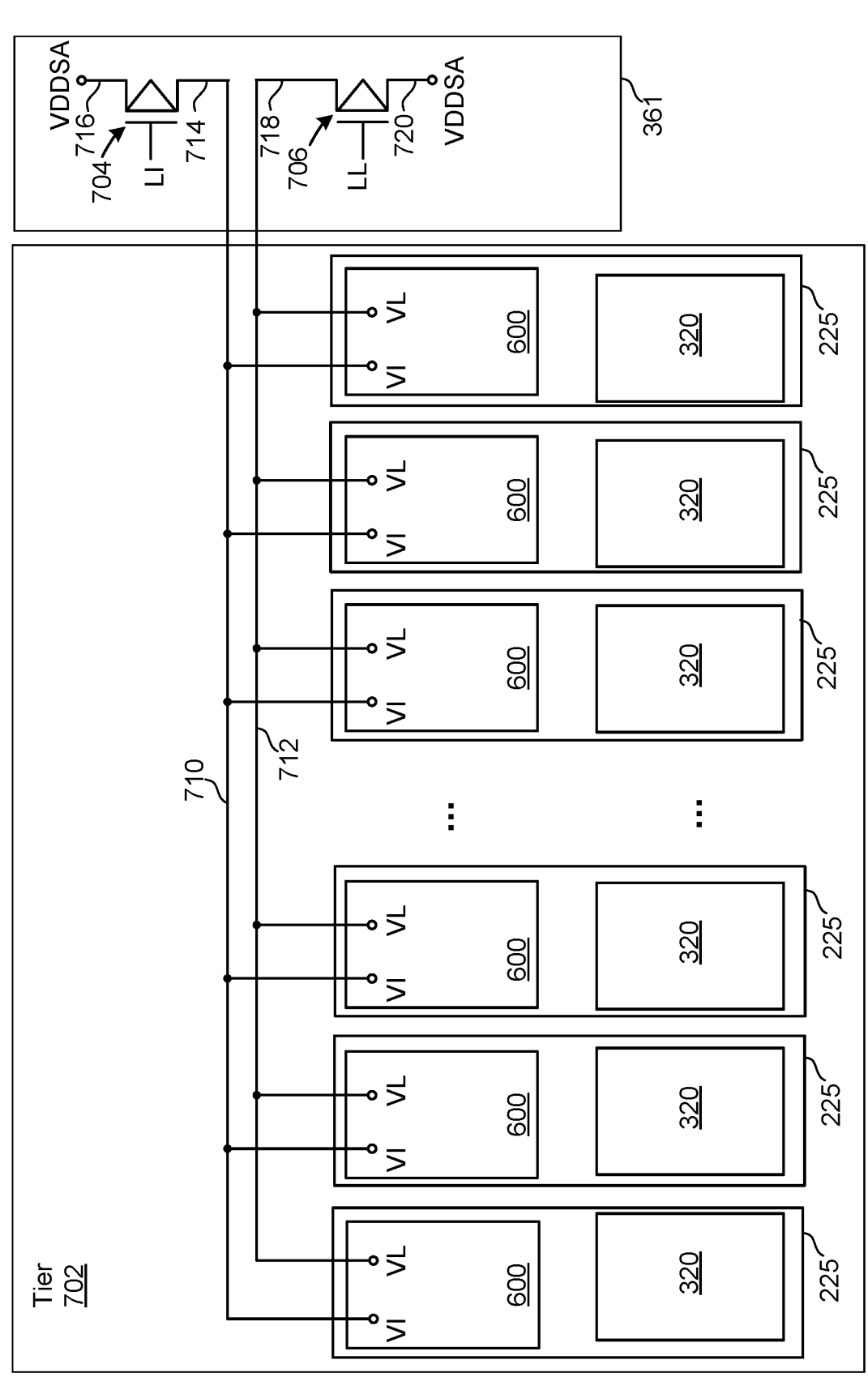
FIG. 7 shows a number of data latches connected to global driver transistors.

FIG. 7 shows a number of data latches 600 connected to global driver transistors. Each data latch 600 may be part of a read/write circuit 225. Each read/write circuit 225 may be connected to a bit line in order to program or read a selected memory cell. The read/write circuit 225 contains a comparison circuit 320. Each data latch 600 is associated with the comparison circuit 320. The comparison circuit 320 is part of a sense amplifier 325 (See FIG. 3C). In general, there is a set of one or more data latches 600 associated with each read/write circuit 225 (see, for example, FIG. 3C). A compact data latch 600 may be part of a sense amplifier (e.g., SDL 322 in sense amplifier 325) or part of a specific read/write circuit 225 but outside of the sense amplifier (e.g., ADL, BDL, CDL, TDL). The read/write circuits 225 are part of what is referred to herein as a tier 702. There are one or more tiers on the die. As one example, there may be about 16 tiers on a die, but there could be more of fewer tiers.

A large group of read/write circuits 225 are grouped together in a tier 702 with global driver transistors in a peripheral region 361 adjacent to the tier 702. Two global driver transistors 704, 706 are depicted in peripheral region 361. In an embodiment the global driver transistors 704, 706 are used to drive one type of compact data latch (e.g., SDL, ADL, BDL, CDL, or TDL) in the associated tier 702. In an embodiment, there is a pair of global driver transistors 704, 706 for each type of compact data latch in the tier 702. For example, if there are five types of compact data latches (e.g., SDL, ADL, BDL, CDL, and TDL) in tier 702 there may be ten global driver transistors 704, 706 in peripheral region 361.

A global VI driver transistor 704 is connected to the VI node in each data latch 600. Electrical line 710 connects a first terminal 714 of global VI driver transistor 704 to the VI node in each data latch 600. Second terminal 716 of global VI driver transistor 704 is connected to a node to which VDDSA is provided. A control signal LI may be applied to the gate of global VI driver transistor 704 to selectively pass VDDSA to the VI node in each data latch 600 or to cut off the VI node in each data latch 600 from VDDSA. Global VI driver transistor 704 is a PMOS transistor in this example. In an embodiment, the memory system operates the global VI driver transistor 704 during a latch operation to prevent shoot through current and/or to prevent a fight between PMOS transistor 608 and NMOS transistor 606 in the compact data latches 600.

A global VL driver transistor 706 is connected to the VL node in each data latch 600. Electrical line 712 connects a first terminal 718 of global VL driver transistor 706 to the VL node in each data latch 600. Second terminal 720 of global VL driver transistor 706 is connected to a node to which VDDSA is provided. A control signal LL may be applied to the gate of global VL driver transistor 706 to selectively pass VDDSA to the VL node in each data latch 600 or to cut off the VL node in each data latch 600 from VDDSA. Global VL driver transistor 706 is a PMOS transistor in this example. In an embodiment, the memory system operates the global VL driver transistor 706 during a latch operation to prevent shoot through current and/or to prevent a fight between PMOS transistor 604 and NMOS transistor 602 in the compact data latches 600.

In an embodiment, the compact data latches 600 are reset to a known state prior to storing a bit in each respective compact data latch 600. In an embodiment, the compact data latches 600 are reset by holding the LBUS to 0V (e.g., VSS) and turning on one of the access transistors (618, 614). For the sake of example, the reset operation results in LAT being at a low voltage (e.g., VSS) and INV being at a high voltage (e.g., VDDSA). The reset operation may include holding LBUS to 0V and connecting LAT to the LBUS by turning on access transistor 614 (with access transistor 618 off). If LAT was at the high voltage prior to the reset, then the high voltage on LAT discharges to the LBUS, thereby resulting in LAT ending at the low voltage. Also, INV will charge to the high voltage when LAT discharges to the low voltage. If LAT was at the low voltage (with INV at the high voltage) prior to the example reset, then LAT remains at the low voltage and INV remains at the high voltage. One of ordinary skill in the art will understand that the reset operation could be reversed to discharge a high voltage on INV.

In an embodiment, a bit is latched into a compact data latch 600 based on the voltage on the LBUS. The phrase "latching a bit" or the like, as used herein, refers to the process of setting LAT to one bit value and INV to the complementary bit value. The LBUS may be established at a low voltage (e.g., 0V) for a first bit value and a high voltage (e.g., VDDSA) for a second bit value. In an embodiment, a data exchange operation is performed between a "source data latch" and a "destination data latch." As one example, the source data latch might be XDL and the destination data latch might be any of ADL, BDL, or CDL. One of the outputs of the source data latch may be connected to the LBUS to establish the voltage on the LBUS. One of the outputs of the destination data latch is connected to the LBUS. As an example, INV of the destination latch may be connected to the LBUS by turning on access transistor 618. If the LBUS is at 0V then INV (assumed to be at the high voltage due to the latch reset) will discharge to LBUS. Therefore, INV will go low and LAT will go high. However, if the LBUS is at a high voltage, then connecting INV to the LBUS will not discharge INV; therefore, INV will remain high and LAT will remain low. One of ordinary skill in the art will understand that a data exchange operation could alternatively connect LAT to the LBUS if, for example, LAT had been set to the high voltage by the latch reset.

Figure 8:
FIG. 8 shows timing of voltages in an embodiment of operating compact data latches.

FIG. 8 shows timing of voltages in an embodiment of operating compact data latches 600. The voltages pertain to discharging LAT and charging INV. Initially, LAT is as VDDSA, INV is at VSS, and the LBUS is at VSS. This example could pertain to resetting a compact data latch with the assumption that LAT starts at VDDSA and INV at VSS. However, this example could also pertain to a data exchange operation in which the source data latch provides VSS to LBUS with the assumption that LAT starts at VDDSA and INV at VSS.

Initially, the control signals SL, LL, TI, and LI are all at VSS. Control signal TL is applied to the gate of access transistor 614 to thereby keep access transistor 614 off. Therefore, LAT is initially disconnected from the LBUS. Control signal TI is applied to the gate of access transistor 618 to thereby keep access transistor 618 off. Therefore, INV is disconnected from the LBUS.

Control signal LI is applied to the gate of global VI transistor 704. While LI is at VSS the global VI (PMOS) transistor 704 will be on. Therefore, global VI transistor 704 will be maintained in an on state throughout the charge/discharge depicted in FIG. 8. The global VI transistor 704 provides VDDSA to the VI nodes in the data latches when the global VI transistor 704 is on. However, as will be described in more detail later, there may be some droop in VDDSA at the VI nodes.

Control signal LL is applied to the gate of global VL transistor 706. While LL is at VSS the global VL transistor 706 will be on; therefore, VDDSA will be provided to the VL node in each data latch 600. While LL is at VDDSA the global VL (PMOS) transistor 706 will be off; therefore, the VL node in each data latch 600 will be cut off from VDDSA. Therefore, the global VL transistor 706 shuts off at t1. However, the voltage at the VL nodes does not necessarily significantly drop even though the VL nodes are cut off from VDDSA. Turning off the global VL transistor 706 may prevent a shoot through current and may also prevent a fight between PMOS transistor 604 and NMOS transistor 602 in the compact data latches 600. At t1 the control signal LL is raised from VSS to VDDSA.

At t2, control signal TL is raised from VSS to VDD to thereby turn on access transistor 614. Therefore, node LAT is connected to the LBUS. At about t2, the voltage at LAT begins to drop from VDDSA towards VSS. In other words, the LAT node discharges to the LBUS. The voltage on LBUS may temporarily rise at about t2 due to the discharge of node LAT. At about t2, the voltage at INV begins to rise from VSS towards VDDSA. Also, at about t2 the voltage at VI may temporarily fall from VDDSA due to the charging of node INV from the VI node. Also note that the voltage at VL may drop from VDDSA at about this time. The drop in VL during latch transition is due to VL being pulled down through the path through the access transistor 614 to the LBUS. However, VL does not drop all the way to VSS. Also note that PMOS transistor 604 does not allow a full discharge to VL. This is because as INV goes up PMOS transistor 604 keeps turning off (due to connection of its gate to INV), which shuts off the path from VL to LBUS.

At t3 the control signal LL is dropped from VDDSA to VSS to thereby turn global VL transistor 706 back on. As a result, the VL node in each compact data latch 600 is again connected to VDDSA. Therefore, the VL node returns to VDDSA. At t3 the control signal TL is dropped from VDD to VSS to thereby shut off access transistor 614. Therefore, LAT node is disconnected from the LBUS. Note that since access transistor 618 is off during the entire process in FIG. 8, INV node is disconnected from LBUS throughout this process.

Figure 9:
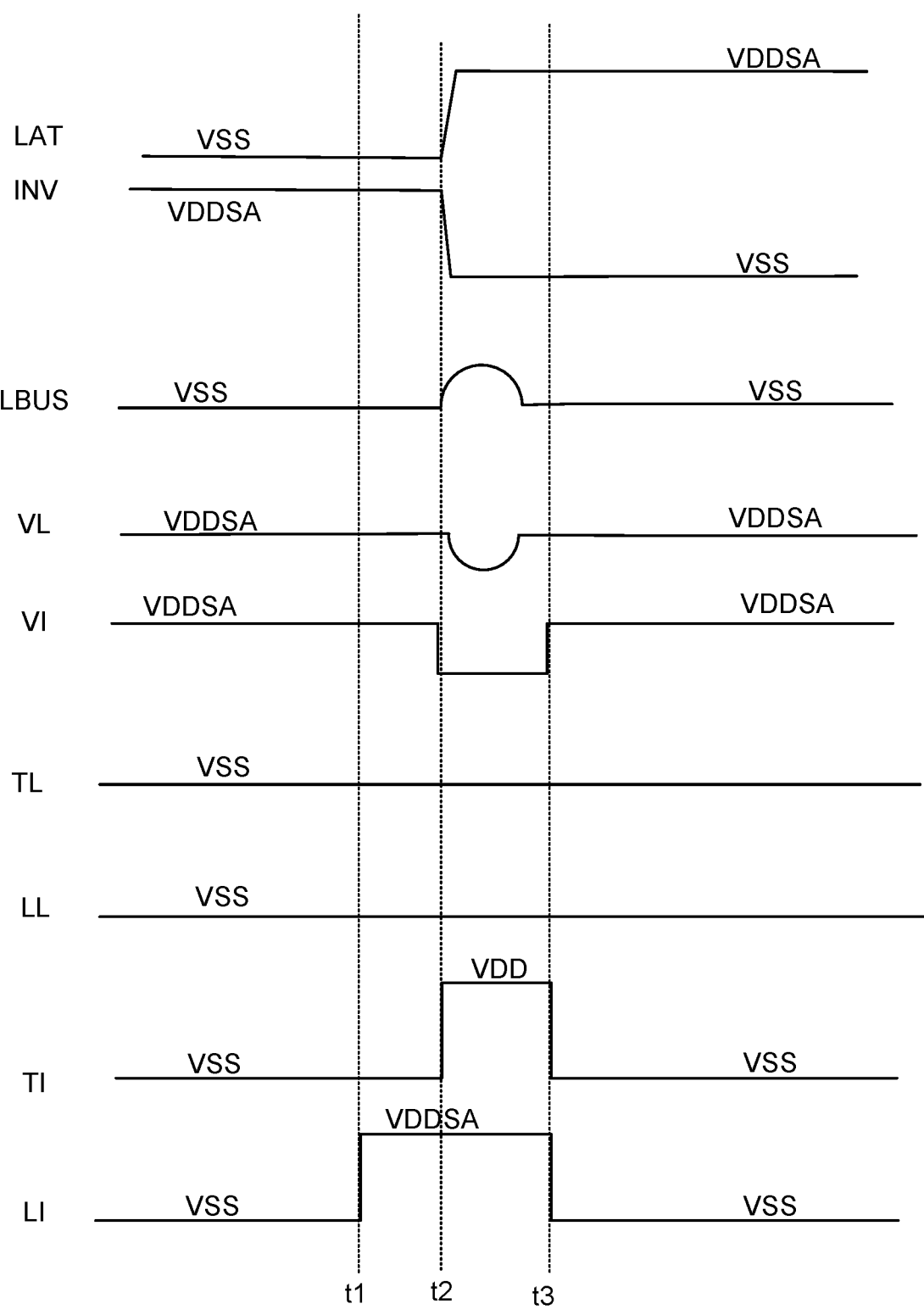
FIG. 9 shows timing of voltages in an embodiment of operating compact data latches.

FIG. 9 shows timing of voltages in an embodiment of operating compact data latches 600. The voltages pertain to discharging node INV and charging node LAT. Initially, node INV is at VDDSA, node LAT is at VSS, and the LBUS is at VSS. This example could pertain to resetting a compact data latch with the assumption that INV starts at VDDSA and LAT at VSS. However, this example could also pertain to a data exchange operation in which the source data latch provides VSS to LBUS with the assumption that INV starts at VDDSA and LAT at VSS. In one embodiment, the timings in FIG. 8 pertain to a larch reset in combination with the timings in FIG. 9 for a data exchange operation. In one embodiment, the timings in FIG. 9 pertain to a latch reset in combination with the timings in FIG. 8 for a data exchange operation.

Operation for the example in FIG. 9 is similar to that described above for discharging LAT and node INV, therefore some common details will not be described again. Initially, LAT is as VSS, INV is at VDDSA, and the LBUS is at VSS. Initially, the control signals SL, LL, TI, and LI are all at VSS.

Global VL transistor 706 will be maintained in an on state throughout the charge/discharge depicted in FIG. 9. The global VL transistor 706 provides VDDSA to the VL nodes in the data latches when the global VL transistor 706 is on. However, as will be described in more detail later, there may be some droop in VDDSA at the VL nodes.

Control signal LI is applied to the gate of global VI transistor 704. While LI is at VSS the global VI transistor 704 will be on; therefore, VDDSA will be provided to the VI node in each data latch 600. While LI is at VDDSA the global VI transistor 704 will be off; therefore, the VI node in each data latch 600 will be cut off from VDDSA. At t1 the control signal LL is raised from VSS to VDDSA. Therefore, the global VI transistor 704 shuts off at t1. However, the voltage at the VI nodes does not necessarily immediately significantly drop even though the VI nodes are cut off from VDDSA. Turning off the global VI transistor 704 may prevent a shoot through current and may also prevent a fight between PMOS transistors 608 and NMOS transistor 606 in the compact data latches 600.

At t2, control signal TI is raised from VSS to VDD to thereby turn on access transistor 618. Therefore, node INV is connected to the LBUS. At about t2, the voltage at INV begins to drop from VDDSA towards VSS. In other words, the INV node discharges to the LBUS. The voltage on LBUS may temporarily rise at about t2 due to the discharge of node INV. At about t2, the voltage at LAT begins to rise from VSS towards VDDSA. Also, at about t2 the voltage at VL may temporarily fall from VDDSA due to the charging of node LAT from the VL node. Also note that the voltage at VI may drop from VDDSA at about this time. The drop in VI during latch transition is due to VI being pulled down through the path through the access transistor 618 to the LBUS. However, VI does not drop all the way to VSS. Also note that PMOS transistor 608 does not allow a full discharge to VI. This is because as LAT goes up PMOS transistor 608 keeps turning off (due to connection of its gate to LAT), which shuts off the path from VI to LBUS.

At t3 the control signal LI is dropped from VDDSA to VSS to thereby turn global VI transistor 704 back on. As a result, the VI node in each compact data latch 600 is again connected to VDDSA. Therefore, the VI node returns to VDDSA. At t3 the control signal TI is dropped from VDD to VSS to thereby shut off access transistor 618. Therefore, INV node is disconnected from the LBUS. Note that since access transistor 614 is off during the entire process in FIG. 9, LAT node is disconnected from LBUS throughout this process.

Figure 10:
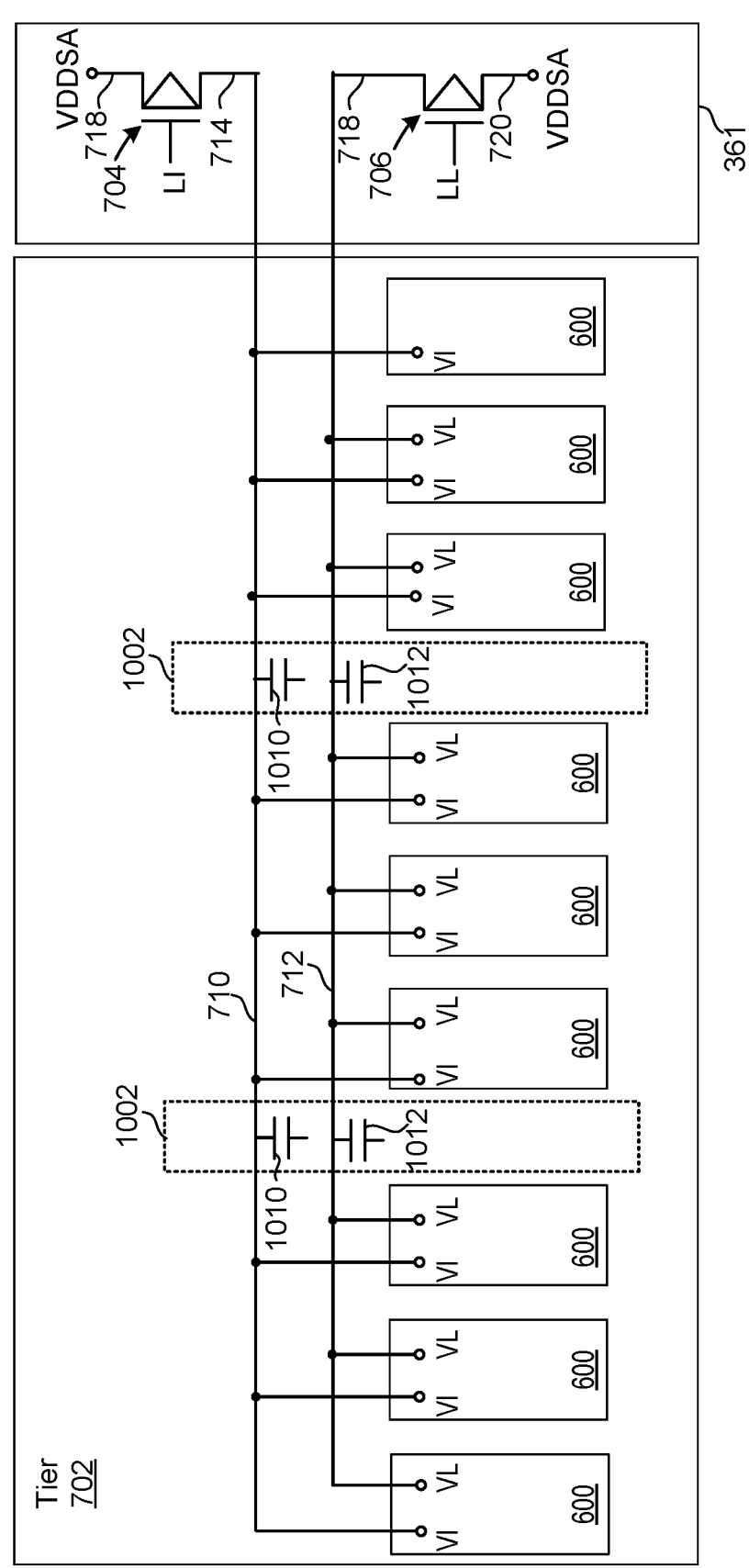
FIG. 10 depicts one embodiment of electrical components used to implement compact data latches.

As noted above, there can possibly be some voltage droop on the VL node or the VI node during a latch operation. FIG. 8 shows possible voltage droop at about t2 at the VI node. FIG. 9 shows possible voltage droop at about t2 at the VL node. The amount of droop may depend on the distance between the compact data latch 600 and the global driver transistor 704, 706 (more droop with greater distance). In one embodiment, capacitors are added to the electrical lines that provide VDDSA from the global transistors to reduce or eliminate such voltage droop. FIG. 10 depicts one embodiment of electrical components used to implement compact data latches 600. A tier 702 having a number of compact data latches 600 is depicted. Each compact data latch 600 may be implemented with the compact data latch depicted in FIG. 6. FIG. 10 shares some elements with FIG. 7, therefore common reference numbers refer to elements described in connection with FIG. 7. A first set of capacitors 1010 are connected to the first electrical line 710. The first set of capacitors 1010 may reduce or eliminate droop of VDDSA provided at the VI nodes in the compact data latches 600. A second set of capacitors 1012 are connected to the second electrical line 712. The second set of capacitors 1012 may reduce or eliminate droop of VDDSA provided at the VL nodes in the compact data latches 600. In an embodiment, the capacitors 1010, 1012 are located in what is referred to as a shunt area 1002, which is a region that does not contain any read/write circuits 225. In an embodiment, there are multiple such shunt areas 1002. Moreover, these shunt areas 1002 may be spaced at regular intervals to thereby allows the capacitors 1010, 1012 to be spaced along the respective lines 710, 712 at regular intervals.

In view of the foregoing, an embodiment includes an apparatus comprising a plurality of data latches, a first global driver transistor, and a second global driver transistor. Each data latch comprises a first inverter having a first transistor, a second transistor, and a first output between the first transistor and the second transistor. The first transistor has a first terminal connected to the first output. The first transistor has second terminal. The second transistor has a first terminal connected to the first output. The second transistor has a second terminal. Each data latch has a second inverter having a third transistor, a fourth transistor, and a second output between the third transistor and the fourth transistor. The third transistor has a first terminal connected to the second output. The third transistor has a second terminal. The fourth transistor has a first terminal connected to the second output. The fourth transistor has a second terminal connected to the second terminal of the second transistor. The first inverter and the second inverter are cross-coupled. The apparatus further has a first global driver transistor coupled to the second terminal of the first transistor in each data latch of the plurality of data latches. The first global driver transistor is configured to receive and selectively pass a first data state voltage to the second terminal of each first transistor. The first data state voltage being higher than a second data state voltage. The apparatus further has a second global driver transistor coupled to the second terminal of the third transistor in each data latch of the plurality of data latches. The second global driver transistor is configured to receive and selectively pass the first data state voltage to the second terminal of each third transistor.

In a further embodiment, the apparatus comprises a control circuit in communication with the plurality of data latches, the first global driver transistor, and the second global driver transistor. The control circuit is configured to maintain the first global driver transistor in an on state during a simultaneous latch operation in each of the data latches to selectively provide the first data state voltage to the second terminal of the first transistor in each data latch of the plurality of data latches and to turn off the second global driver transistor during the latch operation to selectively disconnect the second terminal of the third transistor in each data latch of the plurality of data latches from the first data state voltage in each of the data latches. The latch operation discharges the first data state voltage from the second output of at least a subset of the plurality of data latches.

In a further embodiment, the latch operation in each of the data latches is a first data latch operation. The subset of the plurality of data latches is a first subset. The control circuit is further configured to maintain the second global driver transistor in an on state during a second simultaneous latch operation in each of the data latches to selectively provide the first data state voltage to the second terminal of the third transistor in each data latch of the plurality of data latches and to turn the first global driver transistor off during the second latch operation to selectively disconnect the second terminal of the first transistor in each data latch of the plurality of data latches from the first data state voltage. The second latch operation discharges the first data state voltage from the first output of at least a second subset of the plurality of data latches.

In a further embodiment, the apparatus comprises a plurality comparison circuits. Each comparison circuit is configured to connect to and sense a condition of a selected non-volatile memory cell. Each comparison circuit is associated with a data latch of the plurality of data latches.

In a further embodiment, to perform the latch operation the control circuit is further configured to: for each selected non-volatile memory sell, latch a voltage from the comparison circuit sensing the condition the selected non-volatile memory cell into the data latch associated with the comparison circuit.

In a further embodiment, to perform the latch operation the control circuit is further configured to: latch a respective bit value into each data latch of the plurality of data latches; and program the bit value from each respective data latch into the selected non-volatile memory cell associated with the data latch.

In a further embodiment, each data latch further comprises: a first access transistor coupled between the first output and a local data bus; and a second access transistor coupled between the second output and the local data bus. The control circuit is further configured to provide the second data state voltage on the local data bus of a subset of the plurality of data latches that have the first data state voltage at the second output. And the control circuit is further configured to turn on the second access transistor to connect the second output to the local data bus while the first global driver transistor is on and while the second global driver transistor is off. The first data state voltage on the second output is discharged to the local data bus thereby resulting in the second data state voltage on the second output.

In a further embodiment, the control circuit is configured to provide the second data state voltage on the local data bus in a latch reset operation.

In a further embodiment, the control circuit is configured to provide the second data state voltage on the local data bus of the subset of the plurality of data latches by connecting respective outputs of a different set of data latches to the local data bus of the subset of the plurality in a data exchange operation.

In a further embodiment, the control circuit is further configured to maintain the first access transistor in an off state while the second access transistor and the first global driver transistor are on. The first transistor of the first inverter charges the first output using the voltage from the first global driver transistor when the first transistor is on as a result of discharging the voltage from the second output to the local data bus.

In a further embodiment, the apparatus further comprises a first electrical line connecting the first global driver transistor to the second terminal of the first transistor in each data latch of the plurality of data latches. And the apparatus further comprises a first plurality of capacitors connected to the first electrical line.

In a further embodiment, the apparatus further comprises a second electrical line connecting the second global driver transistor to the second terminal of the third transistor in each data latch of the plurality of data latches. And the apparatus further comprises a second plurality of capacitors connected to the second electrical line.

In a further embodiment, the first plurality of capacitors are located at regular intervals along the first electrical line and the second plurality of capacitors are located at regular intervals along the second electrical line.

In a further embodiment, the first transistor of the first inverter comprises a PMOS transistor, the second transistor of the first inverter comprises an NMOS transistor, the third transistor of the second inverter comprises a PMOS transistor, the fourth transistor of the second inverter comprises an NMOS transistor. Each data latch further comprises a first access transistor coupled between the first output and a local data bus and a second access transistor coupled between the second output and the local data bus.

An embodiment includes a method for operating data latches. The method comprises providing a first data state voltage to a local data bus in each of a plurality of read/write circuits. Each read/write circuit has a sense amplifier and a data latch having a cross-coupled CMOS inverter pair. The cross-coupled CMOS inverter pair having a first PMOS transistor connected to a first latch output and a second PMOS transistor connected to a second latch output. The first latch output of a first set of the data latches has a first data state voltage and the first latch output of a second set of the data latches has a second data state voltage that is greater than the first data state voltage. The method comprises turning off a first global driver transistor connected to a source of the first PMOS transistor in the data latch in each read/write circuit to cut off the source of each first PMOS transistor from the second data state voltage while maintaining a second global driver transistor connected to a source of each second PMOS transistor in the data latch in each read/write circuit in an on state to provide the second data state voltage to the source of each second PMOS transistor. The method comprises connecting the first latch output of each data latch to the local data bus in each respective read/write circuit, thereby discharging the second data state voltage at the first latch output of the first set of the data latches to the local data bus and charging the second latch output of the first set of the data latches to the second data state voltage.

An embodiment includes a non-volatile storge system, comprising a plurality read/write circuits. Each read/write circuit has a comparison circuit, a local data bus, and a set of data latches connected to the local data bus. Each comparison circuit is configured to connect to and sense a condition of a selected non-volatile memory cell. Each data latch comprises a first CMOS inverter and a second CMOS inverter that are cross-coupled. The first CMOS inverter has a first NMOS transistor coupled to a low voltage node and a first PMOS transistor having a first terminal. The first CMOS inverter has a first output at a first node between the first NMOS transistor and the first PMOS transistor. The second CMOS inverter has a second NMOS transistor coupled to the low voltage node and a second PMOS transistor having a first terminal. The second CMOS inverter has a second output at a second node between the second NMOS transistor and the second PMOS transistor. Each data latch comprises a first access transistor coupled between the first output and the local data bus and a second access transistor coupled between the second output and the local data bus. The non-volatile storge system has a first set of global driver transistors that one-to-one correspond to the set of data latches in each read/write circuit. Each global driver transistor in the first set is connected to the first terminal of the first PMOS transistor of a corresponding data latch in the set of data latches in each read/write circuit and configured to selectively provide a first voltage to the first terminal of the first PMOS transistor. The non-volatile storge system has a second set of global driver transistors that correspond to the set of data latches in each read/write circuit. Each global driver transistor in the second set is connected to the first terminal of the second PMOS transistor of a corresponding data latch in the set of data latches in each read/write circuit and is configured to selectively provide the first voltage to the first terminal of the second PMOS transistor.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   a plurality of data latches, each data latch comprising:
      a first inverter having a first transistor, a second transistor, and a first output between the first transistor and the second transistor, the first transistor having a first terminal connected to the first output, the first transistor having second terminal, the second transistor having a first terminal connected to the first output, the second transistor having a second terminal; and
      a second inverter having a third transistor, a fourth transistor, and a second output between the third transistor and the fourth transistor, the third transistor having a first terminal connected to the second output, the third transistor having a second terminal, the fourth transistor having a first terminal connected to the second output, the fourth transistor having a second terminal, wherein the first inverter and the second inverter are cross-coupled with gate terminals of the first transistor and the second transistor connected to the second output and gate terminals of the third transistor and the fourth transistor connected to the first output;
   a single first global driver transistor coupled to the second terminal of the first transistor in each data latch of the plurality of data latches, the single first global driver transistor configured to receive and selectively pass a first data state voltage to the second terminal of each first transistor, the first data state voltage being higher than a second data state voltage; and
   a single second global driver transistor coupled to the second terminal of the third transistor in each data latch of the plurality of data latches, the single second global driver transistor configured to receive and selectively pass the first data state voltage to the second terminal of each third transistor.

2. The apparatus of claim 1, further comprising a control circuit in communication with the plurality of data latches, the first global driver transistor, and the second global driver transistor, the control circuit configured to maintain the first global driver transistor in an on state during a simultaneous latch operation in each of the data latches to selectively provide the first data state voltage to the second terminal of the first transistor in each data latch of the plurality of data latches and to turn off the second global driver transistor during the latch operation to selectively disconnect the second terminal of the third transistor in each data latch of the plurality of data latches from the first data state voltage in each of the data latches, wherein the latch operation discharges the first data state voltage from the second output of at least a subset of the plurality of data latches.

3. The apparatus of claim 2, wherein the latch operation in each of the data latches is a first data latch operation, the subset of the plurality of data latches is a first subset, and the control circuit is further configured to maintain the second global driver transistor in an on state during a second simultaneous latch operation in each of the data latches to selectively provide the first data state voltage to the second terminal of the third transistor in each data latch of the plurality of data latches and to turn the first global driver transistor off during the second simultaneous latch operation to selectively disconnect the second terminal of the first transistor in each data latch of the plurality of data latches from the first data state voltage, wherein the second latch operation discharges the first data state voltage from the first output of at least a second subset of the plurality of data latches.

4. The apparatus of claim 3, further comprising:
a plurality comparison circuits, each comparison circuit configured to connect to and sense a condition of a selected non-volatile memory cell, each comparison circuit associated with a data latch of the plurality of data latches.

5. The apparatus of claim 4, wherein to perform the latch operation the control circuit is further configured to:
for each selected non-volatile memory sell, latch a voltage from the comparison circuit sensing the condition the selected non-volatile memory cell into the data latch associated with the comparison circuit.

6. The apparatus of claim 5, wherein to perform the latch operation the control circuit is further configured to:
latch a respective bit value into each data latch of the plurality of data latches; and
program the bit value from each respective data latch into the selected non-volatile memory cell associated with the data latch.

7. The apparatus of claim 2, wherein:
each data latch further comprises:
a first access transistor coupled between the first output and a local data bus; and
a second access transistor coupled between the second output and the local data bus; and
the control circuit is further configured to:
provide the second data state voltage on the local data bus of a subset of the plurality of data latches that have the first data state voltage at the second output; and
turn on the second access transistor to connect the second output to the local data bus while the first global driver transistor is on and while the second global driver transistor is off, wherein the first data state voltage on the second output is discharged to the local data bus thereby resulting in the second data state voltage on the second output.

8. The apparatus of claim 7, wherein the control circuit is configured to provide the second data state voltage on the local data bus in a latch reset operation.

9. The apparatus of claim 7, wherein the control circuit is configured to provide the second data state voltage on the local data bus of the subset of the plurality of data latches by connecting respective outputs of a different set of data latches to the local data bus of the subset of the plurality in a data exchange operation.

10. The apparatus of claim 7, wherein the control circuit is further configured to:
maintain the first access transistor in an off state while the second access transistor and the first global driver transistor are on, wherein the first transistor of the first inverter charges the first output using the voltage from the first global driver transistor when the first transistor is on as a result of discharging the voltage from the second output to the local data bus.

11. The apparatus of claim 1, further comprising:
a first electrical line connecting the first global driver transistor to the second terminal of the first transistor in each data latch of the plurality of data latches; and
a first plurality of capacitors connected to the first electrical line.

12. The apparatus of claim 11, further comprising:
a second electrical line connecting the second global driver transistor to the second terminal of the third transistor in each data latch of the plurality of data latches; and
a second plurality of capacitors connected to the second electrical line.

13. The apparatus of claim 12, wherein:
the first plurality of capacitors are located at regular intervals along the first electrical line; and
the second plurality of capacitors are located at regular intervals along the second electrical line.

14. The apparatus of claim 1, wherein:
the first transistor of the first inverter comprises a PMOS transistor;
the second transistor of the first inverter comprises an NMOS transistor;
the third transistor of the second inverter comprises a PMOS transistor;
the fourth transistor of the second inverter comprises an NMOS transistor; and
each data latch further comprises:
a first access transistor coupled between the first output and a local data bus; and
a second access transistor coupled between the second output and the local data bus.

15. A method for operating data latches, the method comprising:
providing a first data state voltage to a local data bus in each of a plurality of read/write circuits, each read/write circuit having a sense amplifier and having a data latch having a cross-coupled CMOS inverter pair, the cross-coupled CMOS inverter pair having a first PMOS transistor connected to a first latch output and a second PMOS transistor connected to a second latch output, wherein the first latch output of a first set of the data latches has a first data state voltage and the first latch output of a second set of the data latches has a second data state voltage that is greater than the first data state voltage;

maintaining a first global driver transistor in an on state during a simultaneous latch operation in each of the data latches to selectively provide the second data state voltage to a source terminal of the second PMOS transistor in each data latch and turning off a second global driver transistor during the simultaneous latch operation to selectively disconnect a source terminal of the first PMOS transistor in each data latch from the second data state voltage; and connecting the first latch output of each data latch to the local data bus in each respective read/write circuit while maintaining the first global driver transistor in the on state and keeping the second global driver transistor off, thereby discharging the second data state voltage at the first latch output of the second first set of the data latches to the local data bus and charging the second latch output of the first set of the data latches to the second data state voltage.

16. The method of claim 15, further comprising:

providing a low voltage to a low voltage node connected to a first NMOS transistor of each data latch and to a second NMOS transistor of each data latch, the first NMOS transistor, the second NMOS transistor, the first PMOS transistor, and the second PMOS transistor comprising a cross-coupled CMOS inverter pair, the low voltage being lower than the second data state voltage, the low voltage provided to the low voltage node while discharging the first latch output of each data latch in the second set to the first data state voltage and charging the second latch output of each data latch in the first set to the second data state voltage.

17. A non-volatile storge system, comprising:

a plurality of read/write circuits, each read/write circuit having a comparison circuit, a local data bus, and a first data latch connected to the local data bus, each comparison circuit configured to connect to and sense a condition of a selected non-volatile memory cell, the first data latch in each read/write circuit comprising:

a first CMOS inverter and a second CMOS inverter that are cross-coupled, the first CMOS inverter having a first NMOS transistor coupled to a low voltage node and a first PMOS transistor having a first terminal, the first CMOS inverter having a first output at a first node between the first NMOS transistor and the first PMOS transistor, the second CMOS inverter having a second NMOS transistor coupled to the low voltage node and a second PMOS transistor having a second terminal, the second CMOS inverter having a second output at a second node between the second NMOS transistor and the second PMOS transistor;

a first access transistor coupled between the first output and the local data bus of the read/write circuit; and a second access transistor coupled between the second output and the local data bus of the read/write circuit;

a first global driver transistor;

a first electrical line connecting the first global driver transistor to the first terminal of the first PMOS transistor in the first data latch in each read/write circuit, wherein the first global driver transistor is configured to selectively provide a first voltage to the first terminal of the first PMOS transistor;

a first plurality of capacitors connected to the first electrical line;

a second global driver transistor;

a second electrical line connecting the second global driver transistor to the second terminal of the second PMOS transistor in the first data latch in each read/write circuit, wherein the second global driver transistor is configured to selectively provide a second voltage to the second terminal of the second PMOS transistor; and a second plurality of capacitors connected to the second electrical line.

18. The non-volatile storge system of claim 17, wherein:

the first plurality of capacitors are located at regular intervals along the first electrical line; and the second plurality of capacitors are located at regular intervals along the second electrical line.

* * * * *